United States Patent [19]
Sato et al.

[11] Patent Number: 5,843,810
[45] Date of Patent: Dec. 1, 1998

[54] FILM CIRCUIT AND METHOD OF MANUFACTURING THE SAME

[75] Inventors: Kazuhiro Sato; Kenji Osawa, both of Kanagawa, Japan

[73] Assignee: Sony Corporation, Tokyo, Japan

[21] Appl. No.: 794,203

[22] Filed: Jan. 31, 1997

[30] Foreign Application Priority Data

Feb. 6, 1996 [JP] Japan ..................................... 8-019733

[51] Int. Cl.⁶ ........................... H01L 21/44; H01L 21/48; H01L 21/50
[52] U.S. Cl. ........................... 438/123; 438/121; 438/122; 438/124; 438/125; 438/460; 438/977
[58] Field of Search ................................. 438/121–125, 438/460, 977; 257/688

[56] References Cited

U.S. PATENT DOCUMENTS

| | | | |
|---|---|---|---|
| 5,422,514 | 6/1995 | Griswold et al. | 257/679 |
| 5,474,957 | 12/1995 | Urushima | 437/209 |
| 5,541,447 | 7/1996 | Maejima et al. | 257/669 |
| 5,656,550 | 8/1997 | Tsuji et al. | 438/123 |

*Primary Examiner*—John Niebling
*Assistant Examiner*—David Zarneke
*Attorney, Agent, or Firm*—Hill & Simpson

[57] ABSTRACT

A reinforcing ring surrounding a semiconductor element connected electrically to respective interconnecting portions through electrodes is provided as one body through suspending portions. A film circuit is produced by forming a ring in place of an outer lead for instance by applying a lead frame forming technique in which a laminate of three layers or more is used as a base, an inner lead is formed on one side and an outer lead is formed by a surface layer on another side. In this manner, in a film circuit composed of an insulating film and a plurality of interconnecting portions (leads) electrically connecting between electrodes and other electronic components of a semiconductor element on at least one principal plane of the insulating film, it is made possible to align a ring surrounding a semiconductor element with respect to the semiconductor element only by placing the film circuit on the semiconductor element, and in its turn to reduce assembly mandays of a semiconductor device.

2 Claims, 5 Drawing Sheets

FILM CIRCUIT AND METHOD OF MANUFACTURING THE SAME

BACKGROUND OF THE INVENTION

1. Field of the Invention

The present invention relates to a film circuit composed of an insulating film and a plurality of interconnecting portions for connecting between electrodes of a semiconductor element formed on at least one principal plane thereof and other electronic components with one another electrically and a method of manufacturing the same.

2. Description of Related Art

In some semiconductor devices, a film circuit in which leads connected to the electrodes at one end portions thereof are formed on one face side of an insulating film and external terminals connected to the other end portions of the leads are formed further on another face side of the insulating film is placed on a semiconductor element, and further a reinforcing external ring surrounding the semiconductor element is formed on the outside thereof.

FIG. 8 is a sectional view showing an example of such a semiconductor device.

In FIG. 8, a reference numeral 1 represents a film circuit, 2 represents an insulating film and 3 represents a lead (a interconnecting portion), and one end 3a thereof is connected to an electrode pad 5 composed of aluminum for instance of a semiconductor element 4 and ball-shaped external terminals 6 are formed through holes on a reverse side of the semiconductor element of the insulating film 2 at another end 3b.

The above-mentioned film circuit 1 is placed on the semiconductor element 4 through a buffer material 7 such as silicone grease. 8 represents a reinforcing external ring surrounding the semiconductor element 4, and a gap between the external ring 8 and the semiconductor element 4 has been heretofore sealed by a sealant 9 composed of liquefied epoxy resin or silicone resin, thus fixing the external ring.

Now, it has been essential to arrange the external ring 8 surrounding the semiconductor element 4 around thereof and to fill, after the external ring 8 and the semiconductor element 4 are aligned, the sealant 9 therebetween, and it has been a factor of disturbing reduction of assembly mandays of the semiconductor device that a process of aligning is required. This naturally becomes a factor of obstructing achievement of low cost of the semiconductor device.

SUMMARY OF THE INVENTION

The present invention has been made for the purpose of solving such problems, and has for its object to provide a unique film circuit capable of aligning a ring surrounding a semiconductor element with respect thereto and in its turn capable of reducing assembly mandays of a semiconductor device, and a method of manufacturing the film circuit.

A film circuit is characterized in that interconnecting portions and a ring surrounding a semiconductor element connected electrically to the interconnecting portions through electrodes are provided as one body through suspending portions.

Thus, according to a film circuit set forth above, since a ring is fitted as one body to the film circuit, the ring is positioned with respect to a semiconductor element only by placing the film circuit on the semiconductor element, and it is not required to provide a special process only for providing a ring with a predetermined positional relationship with respect to the semiconductor element.

Accordingly, it becomes possible to aim at reduction in assembly mandays of a semiconductor device, and in its turn to aim at reduction in manufacturing cost of the semiconductor device.

A method of manufacturing a film circuit is a method of manufacturing a semiconductor device composed of an insulating film and interconnecting portions formed at least on one principal plane of the insulating film for connecting between electrodes of a semiconductor element and other electronic components electrically, wherein the interconnecting portions and a ring surrounding the semiconductor element connected electrically to the interconnecting portions through electrodes are provided as one body through suspending portions, comprising the steps of: forming the interconnecting portions and the suspending portions on one surface side of a laminate of three layers or more by a surface layer itself or another metal layer formed on the surface layer and also forming the insulating film; and removing the laminate by selective etching leaving at least the circumference thereof, thereby to form the ring.

According to the manufacturing method set forth above, it is possible to obtain a film circuit with a ring by forming a ring in place of an outer lead or by forming a ring of the same layer as an inner lead by applying a lead frame forming technique of using a laminate of three layers or more, forming an inner lead on one side and forming an outer lead of a surface layer on another side, and it is possible to obtain the film circuit set forth above easily by utilizing an already developed lead frame manufacturing technique as it is.

BRIEF DESCRIPTION OF THE DRAWINGS

FIG. 1A and FIG. 1B show a first embodiment of a film circuit according to the present invention, in which FIG. 1A is a plan view and FIG. 1B is a sectional view taken along a line II—II in FIG. 1A;

DESCRIPTION OF THE PREFERRED EMBODIMENTS

The present invention will be described in detail hereinafter in accordance with illustrated embodiments.

Figure 1A:
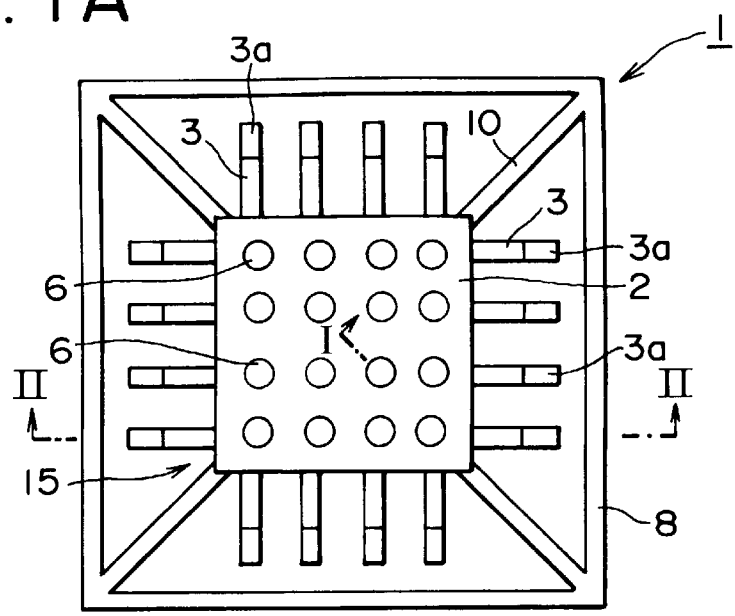
Figure 1B:
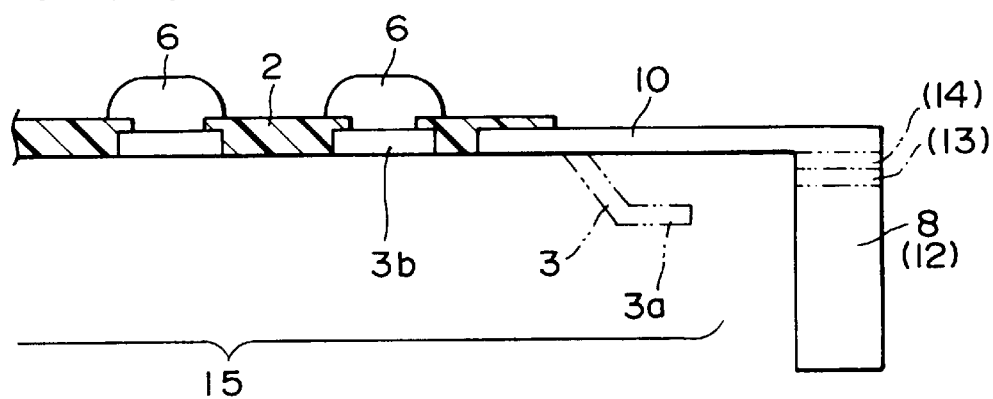

FIGS. 1A and 1B show a first embodiment of the present invention, in which FIG. 1A is a plan view thereof and FIG. 1B is an enlarged sectional view taken along a line II—II in FIG. 1A.

In these figures, a reference numeral 1 represents a film circuit and 2 represents an insulating film which forms a base of the film circuit 1. 3, 3, . . . represent leads (interconnecting portions) formed on one side (under side) of the insulating film 2, and tip portions 3a are connected to electrode pads 5 of a semiconductor element 4. The leads 3, 3, . . . are formed by forming a metal such as copper or nickel with resist having a negative pattern with respect to a pattern to be formed as a mask.

Reference numerals 6, 6, . . . represent ball-shaped external terminals formed on end portions 3b, 3b, . . . on the side opposite to the side where respective leads 3, 3, . . . are connected to the electrode pads 5 of the semiconductor element 4, and are composed of nickel, solder or gold for example and formed on a surface on the reverse semiconductor element side of the base (insulating film) 2, and connected to the end portions 3b of the leads 3 through holes of the base 2.

A reference numeral 8 represents a reinforcing external ring surrounding the semiconductor element 4, and is formed as one body on the outside of the principal part of the film circuit through suspending portions 10, 10, 10 and 10, and has a lamination structure composed of, for example, copper, aluminum, copper, nickel or the like. On the other hand, the suspending portions 10, 10, 10 and 10 are composed of the same layers as the leads 3, 3, . . . , thus being composed of copper or nickel for instance.

Figure 2:
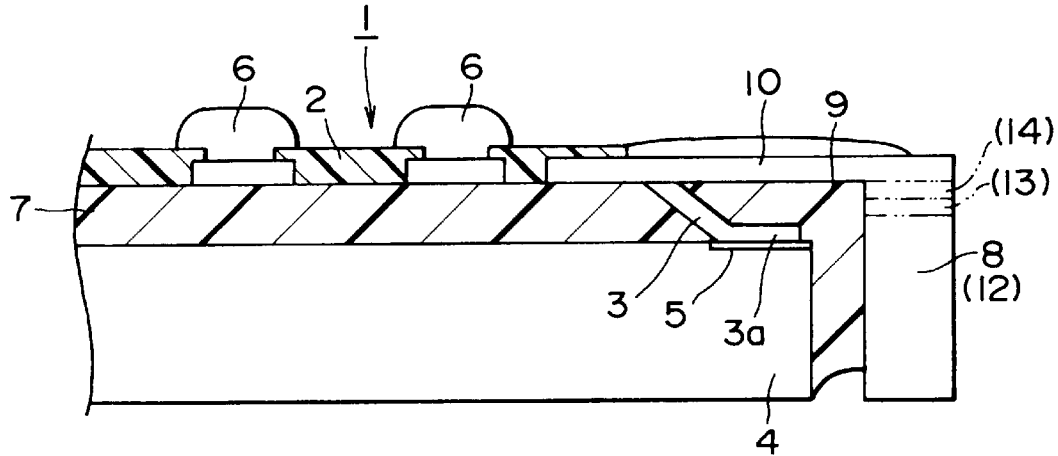
FIG. 2 is a sectional view showing a semiconductor device in which the film circuit shown in FIGS. 1A and 1B is assembled into a semiconductor element.

In the present film circuit, the external ring 8 is formed as one body in the outside portion of the principal part 15 of the film circuit through the suspending portions 10, 10, 10 and 10 as shown in FIGS. 1A and 1B. Therefore, the ring 8 is positioned with respect to the semiconductor element 4 only by placing the film circuit 1 on the semiconductor element 4 as shown in FIG. 2. Thus, it is not required to provide a special process of providing the ring 8 in a predetermined positional relationship with respect to the semiconductor element 4.

Accordingly, it becomes possible to aim at reduction in assembly mandays of the semiconductor device, and in its turn to aim at reduction in the manufacturing cost of the semiconductor device.

Besides, in FIG. 2, 4 represents a semiconductor element, 5 represents an electrode pad thereof, and 7 represents a buffer composed of silicone grease for instance which is made to lie between the film circuit 1 and the semiconductor element 4. 9 represents a sealant for sealing between the external ring 8 and the semiconductor element 4 and between the external ring 8 and the film circuit 1 and fixing those components.

Next, a method of manufacturing a film circuit 1 according to the present invention will be described in accordance with FIG. 3A to FIG. 3H that are sectional views taken along a line II—II in FIG. 1A. The present manufacturing method is applied with a lead frame manufacturing technique (the techniques disclosed in JP-A-7-211834 and JP-A-7-147364 adopt this lead frame manufacturing technique) in which outer leads are formed on one side and inner leads are formed on another side with a metal laminate having a three layer structure as a base, and has remarkable features in that leads 3, 3, . . . and suspending portions 10, 10, 10 and 10 of the film circuit 1 are formed in place of inner leads and the external ring 8 is formed in place of the outer lead.

Figure 3A:
FIG. 3A to FIG. 3H are sectional views showing an example of a method of manufacturing a film circuit according to the present invention in the order of process.

(A) First, as shown in FIG. 3A, a metal laminate 11 having a three layer structure is prepared. The laminate 11 is obtained by laminating a copper layer 12 having a thickness of 150 μm for example which becomes the ring 8, an aluminum layer 13 having a thickness of 3 μm for example which plays a roll as an etching stopper and a plating substrate layer 14 composed of copper or nickel having a thickness of 2 μm for example.

Figure 3B:
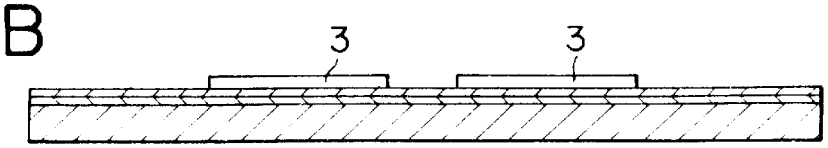

(B) Next, as shown in FIG. 3B, the leads 3, 3, . . . and the suspending portions 10, 10, 10 and 10 are formed on the plating substrate layer 14. The leads 3, 3, . . . and the suspending portions 10, 10, 10 and 10 can be formed by applying resist having a negative pattern against the pattern to be formed by those parts and plating copper (or nickel) in a plated thickness of 30 μm for example with the layer 14 as the substrate and with the resist as a mask.

Figure 3C:

(C) Next, as shown in FIG. 3C, a lead frame configuration in which a plurality of film circuits are coupled as one body is formed by applying etching to the metal laminate 11 penetrating therethrough selectively from both sides thereof.

Figure 3D:
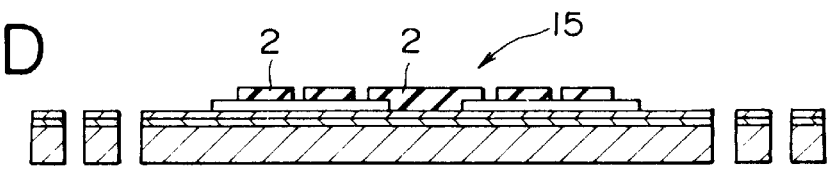

(D) Next, as shown in FIG. 3D, an insulating film 2 is formed selectively on the surface on the lead forming side of the laminate 11.

Figure 3E:
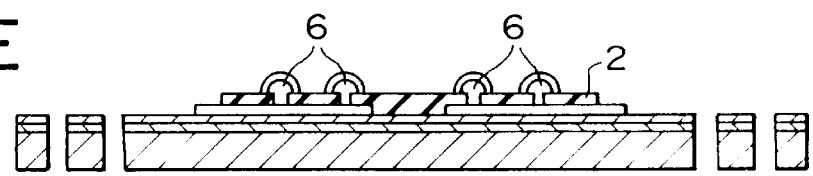

(E) Next, as shown in FIG. 3E, solder balls 6, 6, . . . which become external terminals are formed on the surfaces of the leads 3, 3, . . . with the insulating film 2 as a mask. The solder balls 6, 6, . . . are formed by nickel plating in a thickness of 80 μm for example and solder or gold plating in a thickness of 30 μm for example.

Figure 3F:
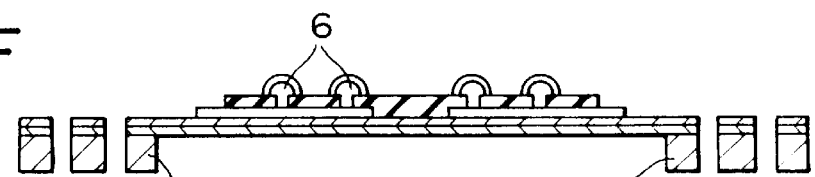

(F) Next, as shown in FIG. 3F, the inside of the portion 8 which becomes an external ring of the thick copper layer 12 located on the rear side of the laminate 11 is removed by selective etching from the back side. Besides, the aluminum layer 13 serves as an etching stopper at this time. At this stage, the aluminum layer 13 shows a state that the layer 13 is still existent except the portion which has been removed at the time of selective etching shown in FIG. 3C.

Figure 3G:
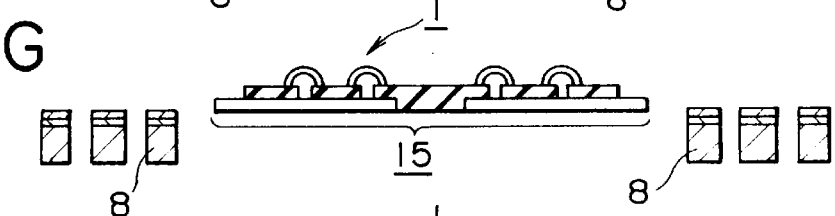

(G) Next, as shown in FIG. 3G, using the leads 3, 3, . . . and the suspending portions 10, 10, 10 and 10 (here none of the suspending portions 10 is shown in FIG. 3) as a mask, the plating substrate layer 14 which is the substrate for them and the aluminum layer 13 which has been the etching stopper are etched. With this, respective leads 3, 3, . . . and suspending portions 10, 10, 10 and 10 become independent of others, and a state that they are electrically short-circuited with each other disappears for the first time. 15 represents a principal part of the film circuit 1, and the principal part 15 looks as if it were separated from the external ring 8 in FIG. 3G. However, it is because of such a reason that the suspending portions 10, 10, 10 and 10 are not shown in the section shown in FIG. 3, and the principal part 15 is connected practically as one body with the external ring 8 through the suspending portions 10, 10, 10 and 10 of the part 15.

Figure 3H:
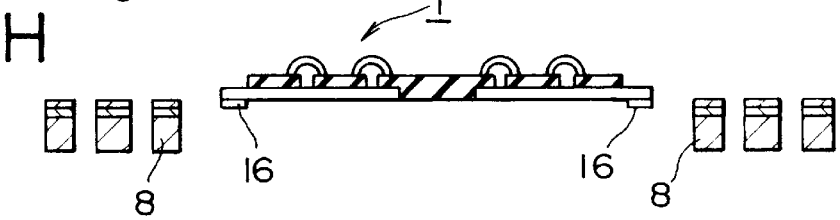

(H) Next, as shown in FIG. 3H at need, bumps 16, 16, . . . are formed at tip portions 3a, 3a, . . . of respective leads 3, 3, . . . . This process is not required in the case of the film circuit 1 shown in FIG. 1 since no bump is provided, but there are bumps in the modification example shown in FIG. 5 described later, and, when the film circuit of the modification example is manufactured, bumps are formed in this process. Besides, the bumps are formed on the side of the semiconductor element 4 in some cases.

According to such a method, it is possible to manufacture a film circuit according to the present invention by utilizing a method of manufacturing a lead frame as it is in which outer leads are formed on one side and inner leads are formed on another side with a laminated metal plate having a three layer structure as a base.

Besides, the leads have been formed by growing a plated film with a resist portion formed selectively on a plating substrate film as a mask in the present embodiment, but the leads may also be formed by having the layer 14 composed of copper or nickel formed on the thick side and patterning the layer 14 by selective etching.

FIG. 4A to FIG. 4D show assembly of the film circuit 1 into the semiconductor element in the sequence of process.

Figure 4A:
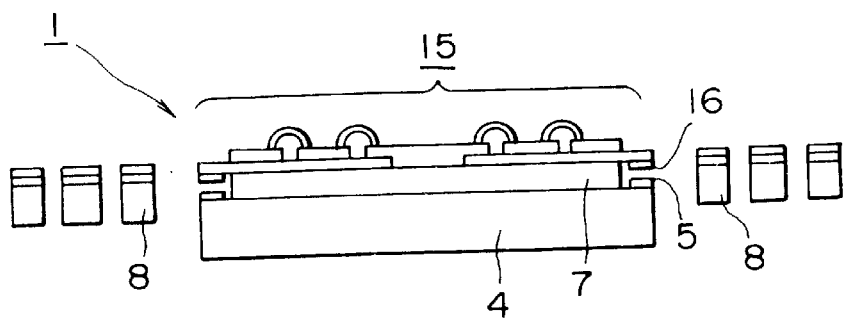
FIG. 4A to FIG. 4D are sectional views showing an example of a method of assembling a film circuit according to the present invention into a semiconductor element in the order of process.

(A) First, as shown in FIG. 4A, the film circuit 1 in a lead frame shape is positioned on an aligned semiconductor element 4 in a state that a buffer 7 is made to lie therebetween.

Figure 4B:
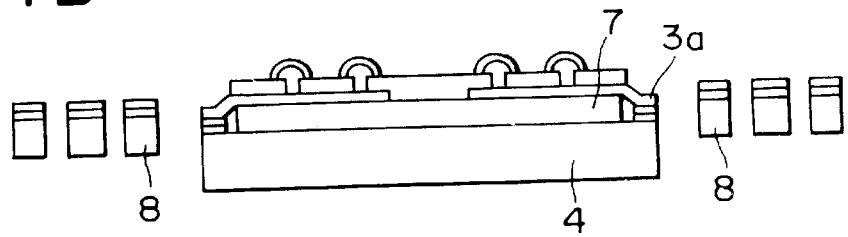

(B) Next, as shown in FIG. 4B, the tip portions 3a, b3a, . . . of respective leads 3, 3, . . . are connected to electrode pads 5, 5, . . . of the semiconductor element 4 by means of single point bonding for example.

Figure 4C:
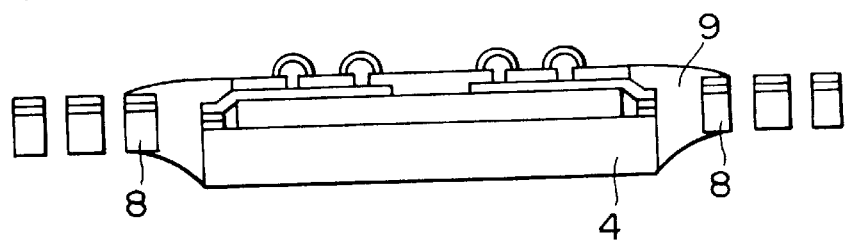

(C) Next, as shown in FIG. 4C, a sealant 9 such as epoxy resin or silicone resin is injected among the semiconductor element 4, the film circuit 1 and the external ring 8 by potting so as to seal these parts, and fixes among the semiconductor element 4, the film circuit 1 and the external ring 8.

Figure 4D:
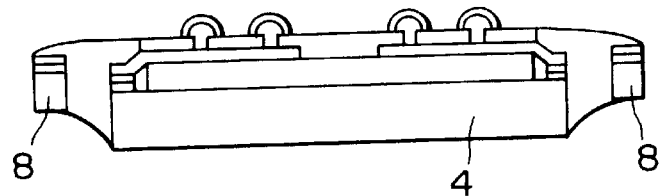

(D) Next, the film circuit 1 is separated from other parts as shown in FIG. 4D by cutting unnecessary parts of the lead frame in which a plurality of film circuits 1 are connected as one body. With this, it is possible to obtain a semiconductor device having the film circuit 1 as an intermediate circuit substrate, having external terminals 6, 6, . . . in a ball grid array form connected to respective electrodes of the semiconductor element 4 on the intermediate circuit substrate, and reinforced by means of the external ring 8.

Further, according to such an assembly method, the external ring 8 is formed as one body with the film circuit 1. Therefore, when the film circuit 1 is positioned with respect to the semiconductor element 4, the external ring 8 is also positioned spontaneously with respect to the semiconductor element 4. Thus, a special process of positioning the external ring 8 with respect to the semiconductor element 4 and the film circuit 1 is not required.

Figure 5:
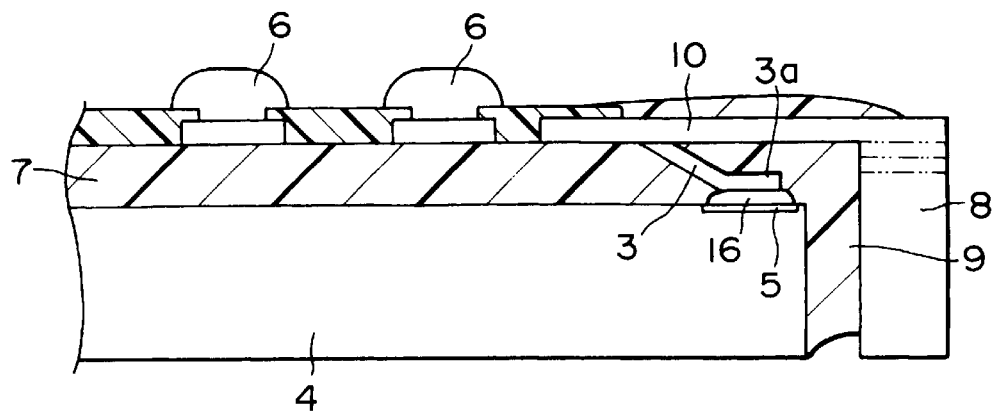
FIG. 5 is a sectional view showing a modification example of the film circuit shown in FIGS. 1A and 1B.

FIG. 5 is a sectional view showing a modification example of the film circuit shown in FIG. 1. What differs from that shown in FIG. 1 in the present modification example is nothing but that the tip portion 3a of each lead 3 is bonded to the electrode pad 5 through the metal bump 16 formed on the semiconductor element 4.

Figure 6A:
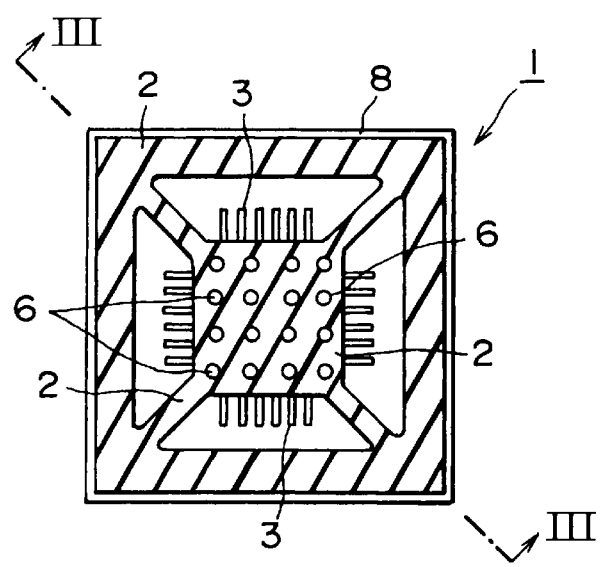
FIG. 6A and FIG. 6B are sectional views showing another modification example of the film circuit shown in FIGS. 1A and 1B.
Figure 6B:
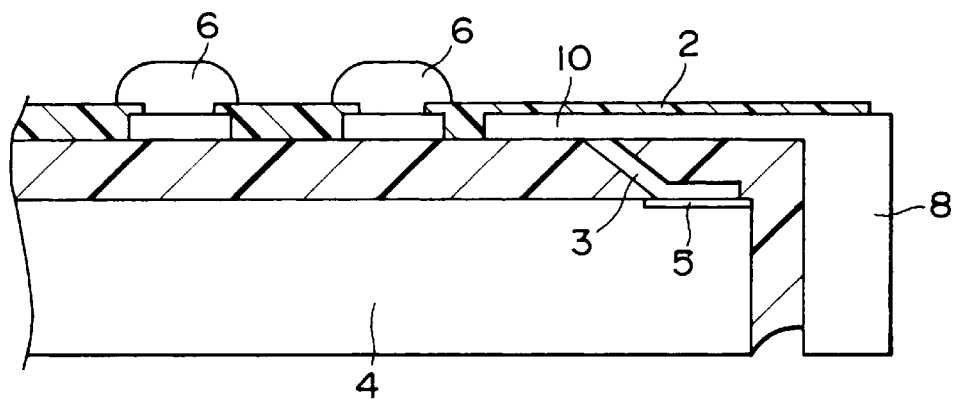

FIG. 6A and FIG. 6B show another modification example of the film circuit shown in FIG. 1, in which FIG. 6A is a plan view and FIG. 6B is a sectional view.

The difference from the film circuit 1 shown in FIG. 1 in the present modification example exists in the pattern of the insulating film 2 [a hatching with heavy lines is shown in FIG. 1A for the purpose of making the pattern intelligible], and the strength of the film circuit is made higher by forming the pattern wider. However, there is no difference in the points other than the above.

Figure 7:
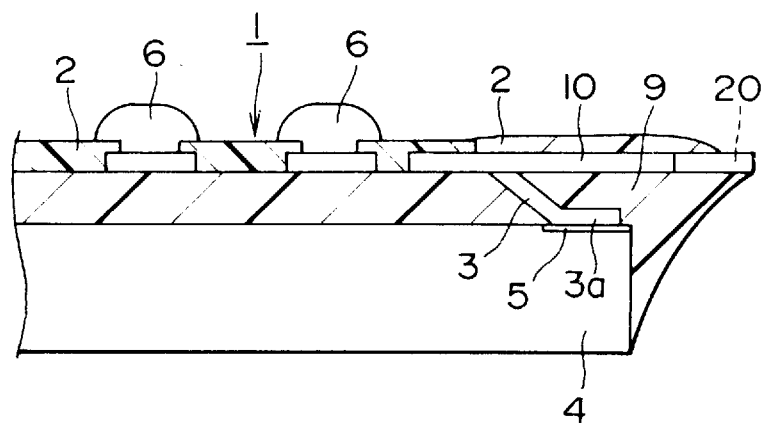
FIG. 7 is a sectional view showing still another modification example of the film circuit shown in FIGS. 1A and 1B.
Figure 8:
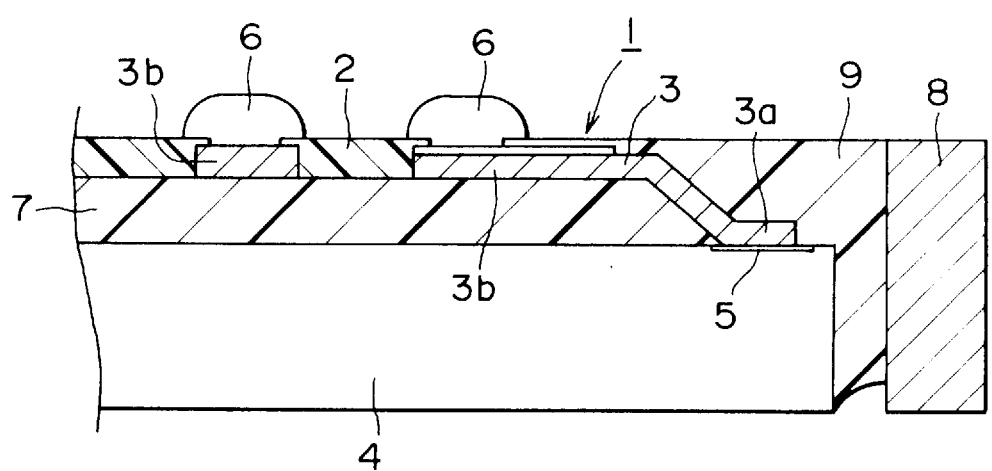
FIG. 8 is a sectional view showing an example.

Besides, the external ring is not necessarily required to be formed thick as the ring 8 of respective film circuits 1, and may be formed thin as shown in FIG. 7. Because the sealant 9 largely contributes to fixing of the positional relationship between the ring 8 and the film circuit 1 and increases the reinforcing effect of the ring 8. Namely, in an embodiment shown in FIG. 7, the ring is formed of a metal layer composed of copper or nickel of the same layer of the lead 3 or the suspending portion 10 by also removing a portion corresponding to the ring in a process of etching a thick copper layer 12 shown in FIG. 3F, and 20 is affixed to that ring as a reference numeral in FIG. 7.

Further, in the above-mentioned embodiment, the suspending portions 10 have been provided at four corners of the film circuit 1, which, however, is not limited thereto, but these portions 10 may be provided at intermediate portions of respective pieces.

According to a film circuit set forth above, since the ring is fitted to the film circuit as one body, the ring is positioned with respect to the semiconductor element only by placing the film circuit on the semiconductor element, and it is not required to provide a special process only for providing the ring in a predetermined positional relationship with respect to the film circuit.

Therefore, it becomes possible to aim at reduction in assembly mandays of the semiconductor device, and in its turn to aim at reduction in the manufacturing cost of the semiconductor device.

According to the manufacturing method set forth above, it is possible to obtain a film circuit with a ring by forming a ring in place of an outer lead or by forming a ring of the same layer as an inner lead utilizing a lead frame forming technique in which a laminate of three layers or more is used as a base, an inner lead is formed on one side and an outer lead is formed of a surface layer on another side, and it is possible to obtain the film circuit set forth above easily by applying an already developed lead frame manufacturing technique as it is.

What is claimed is:

1. A method of manufacturing a semiconductor device composed of an insulating film and interconnecting portions formed at least on one principal plane of said insulating film for connecting between electrodes of a semiconductor element and other electronic components electrically, wherein said interconnecting portions and a ring surrounding said semiconductor element connected electrically to said interconnecting portions through electrodes are provided as one body through suspending portions, comprising the steps of:

forming said interconnecting portions and said suspending portions on one surface side of a laminate of three layers or more by a surface layer itself or another metal layer formed on said surface layer and also forming said insulating film; and removing said laminate by selective etching leaving at least the circumference thereof, thereby forming said ring.

2. A method of manufacturing a semiconductor device composed of an insulating film and interconnecting portions formed at least on one principal plane of said insulating film for connecting between electrodes of a semiconductor element and other electronic components electrically, wherein said interconnecting portions and a ring surrounding said semiconductor element connected electrically to said interconnecting portions through electrodes are provided as one body through suspending portions, comprising the steps of:

forming said interconnecting portions, said suspending portions and said ring portion on one surface side of a laminate of three layers or more by the surface layer itself or another metal layer formed on said surface layer;

forming an insulating film; and removing portions in said laminate other than said interconnecting portions, said suspending portions, and said ring portion by means of selective etching.

* * * * *